United States Patent [19]

Goetting et al.

[11] Patent Number: 5,039,885

[45] Date of Patent: Aug. 13, 1991

[54] SINGLE FUNCTION PROGRAMMABLE LOGIC ARRAY CIRCUIT

[75] Inventors: Erich Goetting, Cupertino; Yun Hwang, Sunnyvale, both of Calif.

[73] Assignee: Exel Microelectronics, Inc., San Jose, Calif.

[21] Appl. No.: 856,539

[22] Filed: Apr. 25, 1986

[51] Int. Cl.$^5$ .................... G06F 7/38; H03K 19/17
[52] U.S. Cl. ...................... 307/468; 307/445; 307/448; 364/716; 340/825.04; 340/825.05
[58] Field of Search ............ 307/445, 448, 465, 468; 364/716; 340/825.04, 825.05

[56] References Cited

U.S. PATENT DOCUMENTS

| | | | |
|---|---|---|---|
| 4,501,977 | 2/1985 | Koike | 364/716 |
| 4,587,445 | 5/1986 | Kanuma | 307/465 |
| 4,703,206 | 10/1987 | Cavlan | 307/443 |

OTHER PUBLICATIONS

Specification for Am. PAL22V10, Advanced Micro Devices.
Programmable Logic Design Techniques—WESCON 1985—"Third Generation PLD Architecture Breaks and/or Bottleneck" Napoleone Cavlan.
Programmable Logic Devices—*Electronic Design*—Jan. 9, 1986—Dave Bursky.

*Primary Examiner*—Stanley D. Miller
*Assistant Examiner*—Margaret Rose Wambach
*Attorney, Agent, or Firm*—Townsend & Townsend

[57] ABSTRACT

A programmable logic array which can produce single level logic or can produce multiple level logic through the use of internal feedback loops. A plurality of input lines intersect a plurality of term lines and can be programmable coupled to the term lines. A number of term lines provide a feedback input which intersects all of the term lines and can be programmably coupled to the tem lines. Teh input lines and the feedback input lines form a single matrix with the term lines.

2 Claims, 11 Drawing Sheets

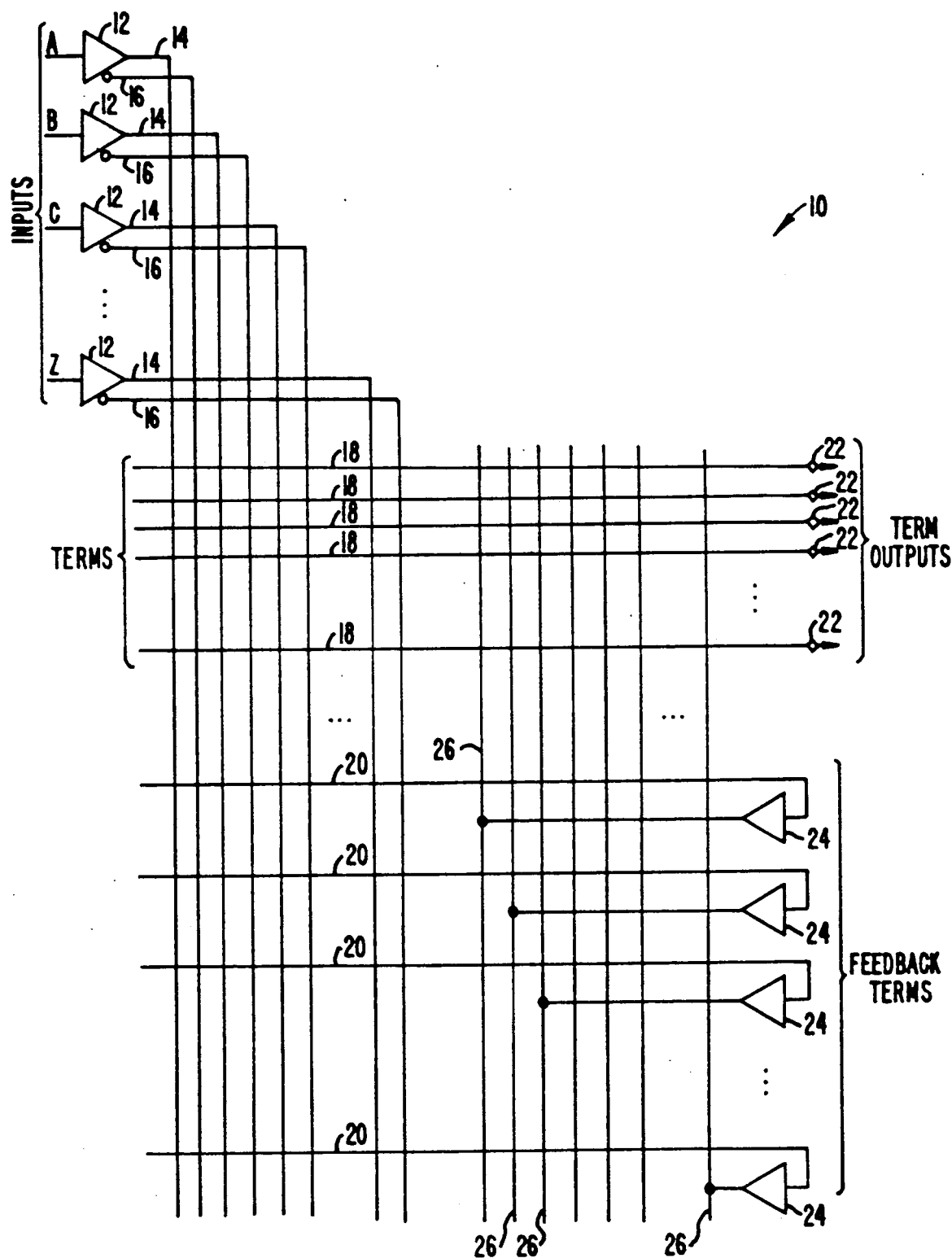
FIG._1.

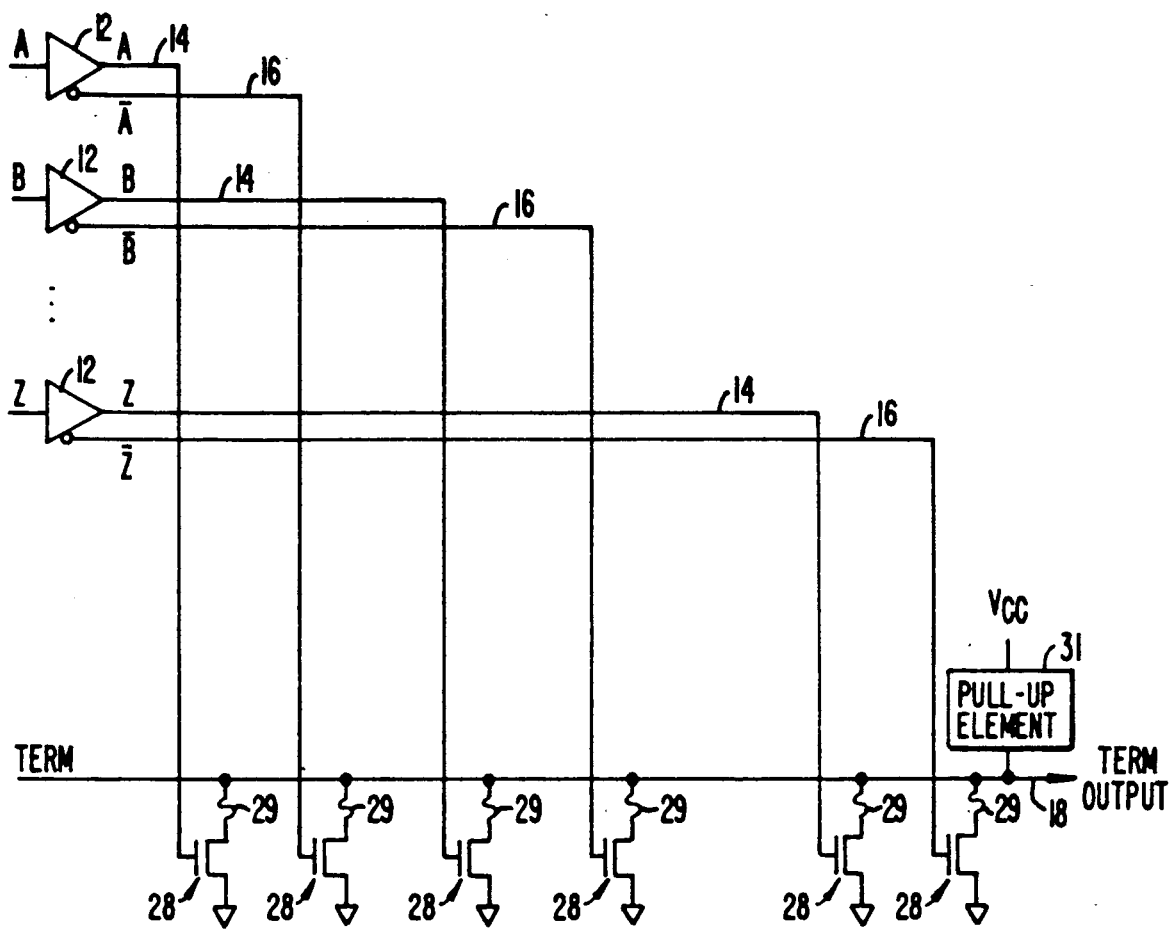
FIG._2.
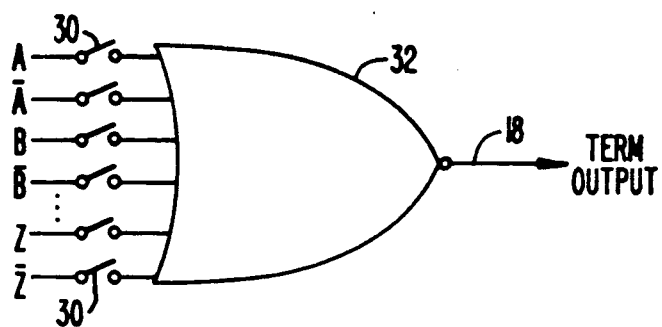
FIG._2A.

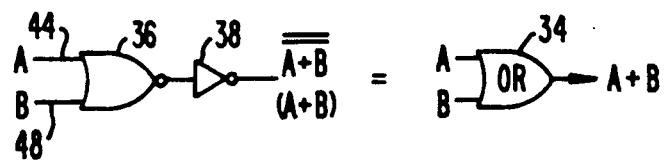
FIG._3.
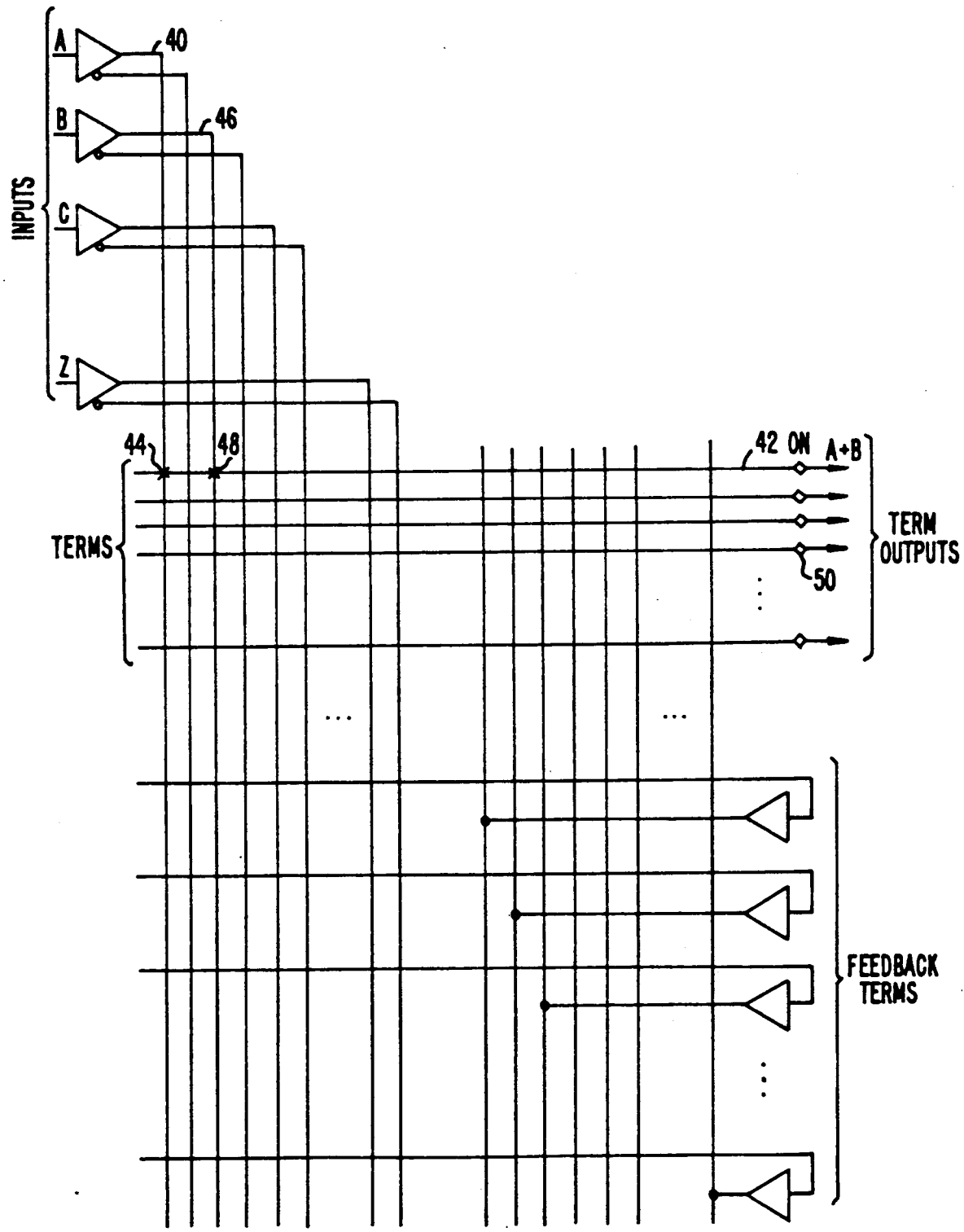
FIG._3A.

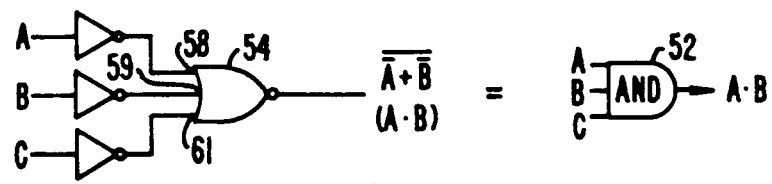
FIG._4.
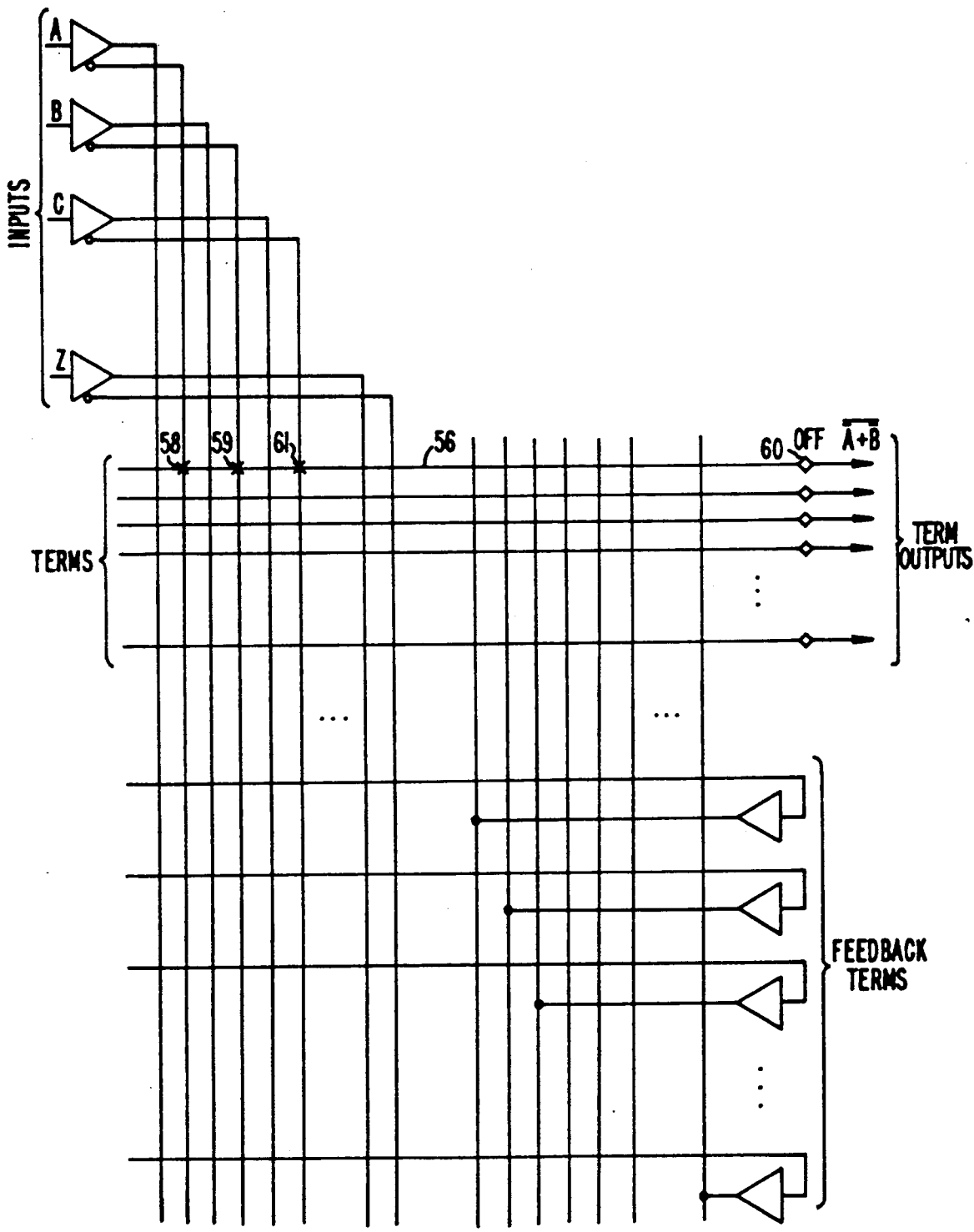
FIG._4A.

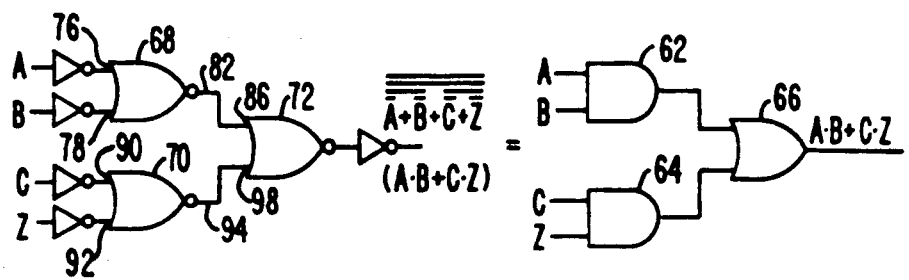
FIG._5.
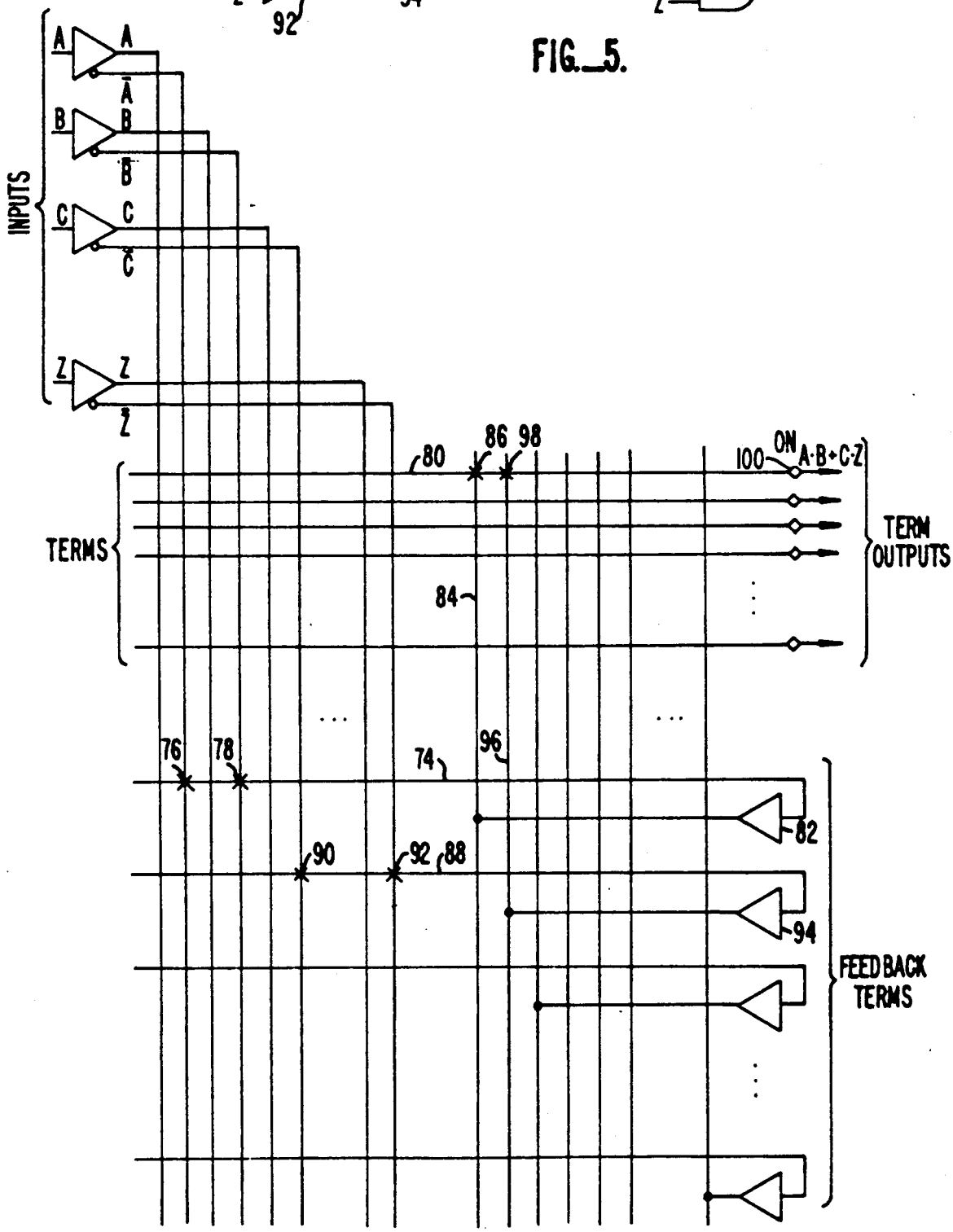
FIG._5A.

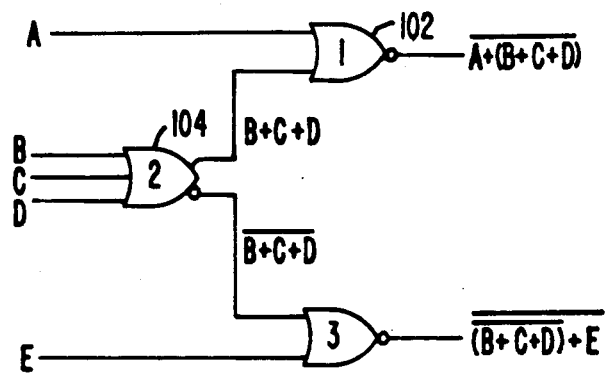
UNREDUCED LOGIC
FIG._5B.
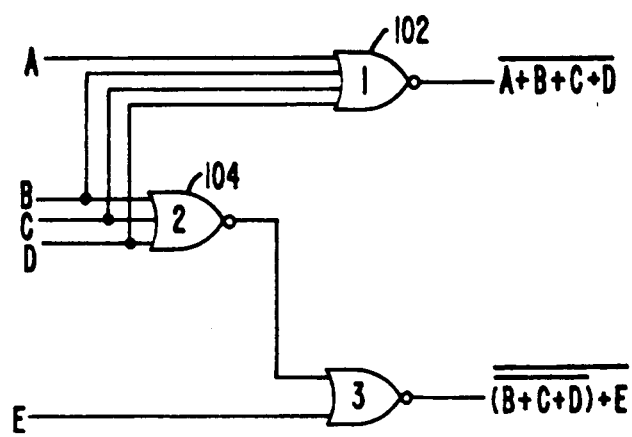
REDUCED LOGIC
FIG._5C.
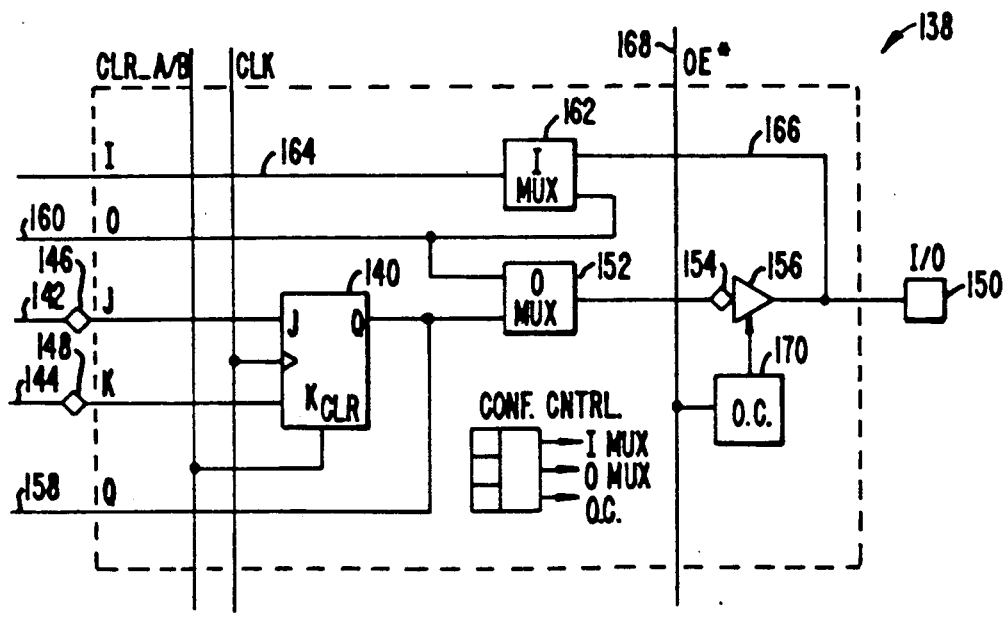
FIG._8.

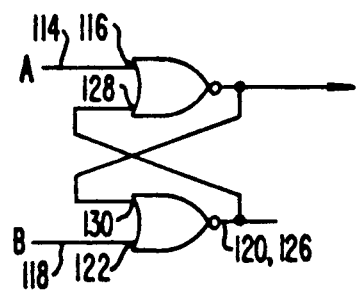
FIG._6.
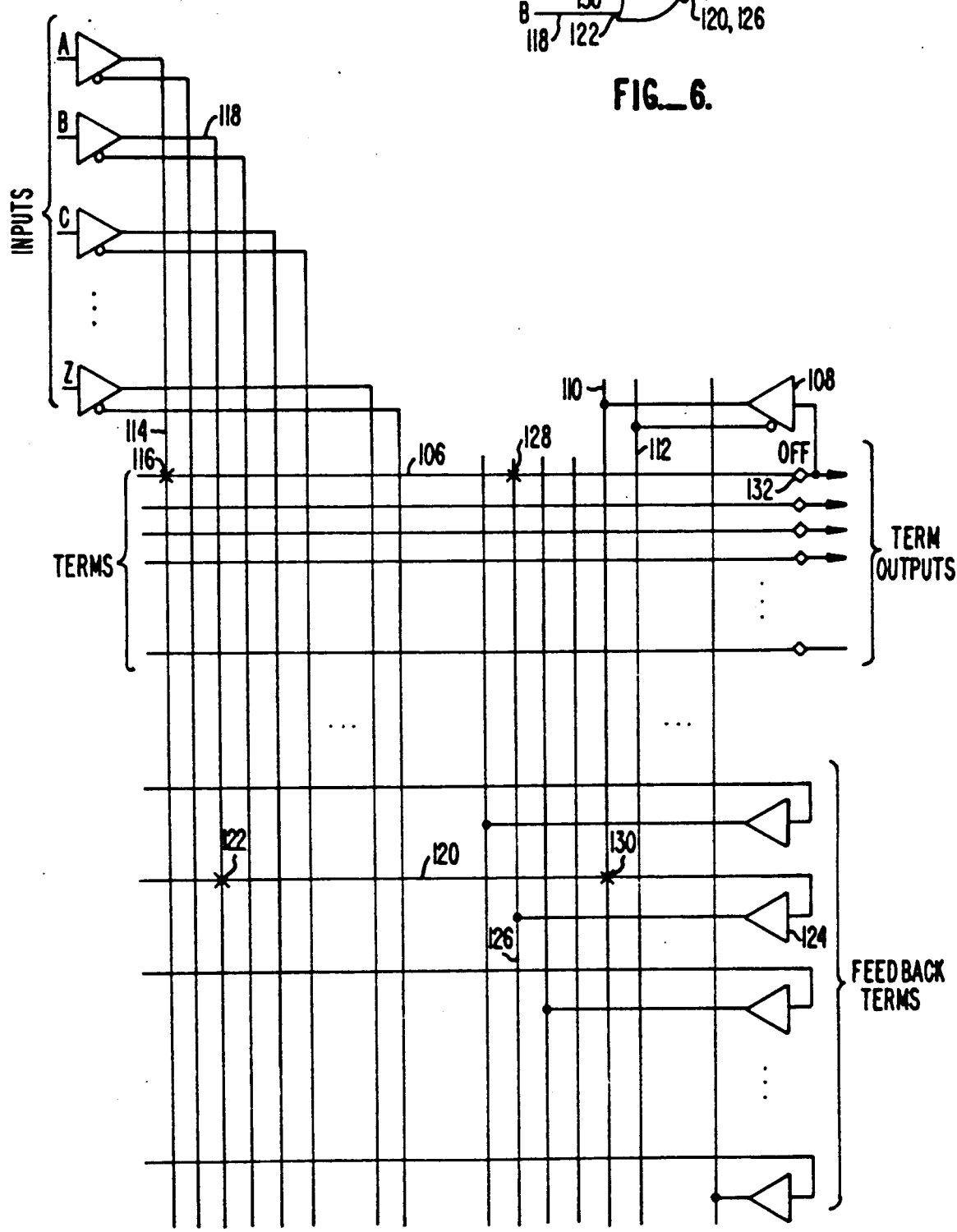
FIG._6A.

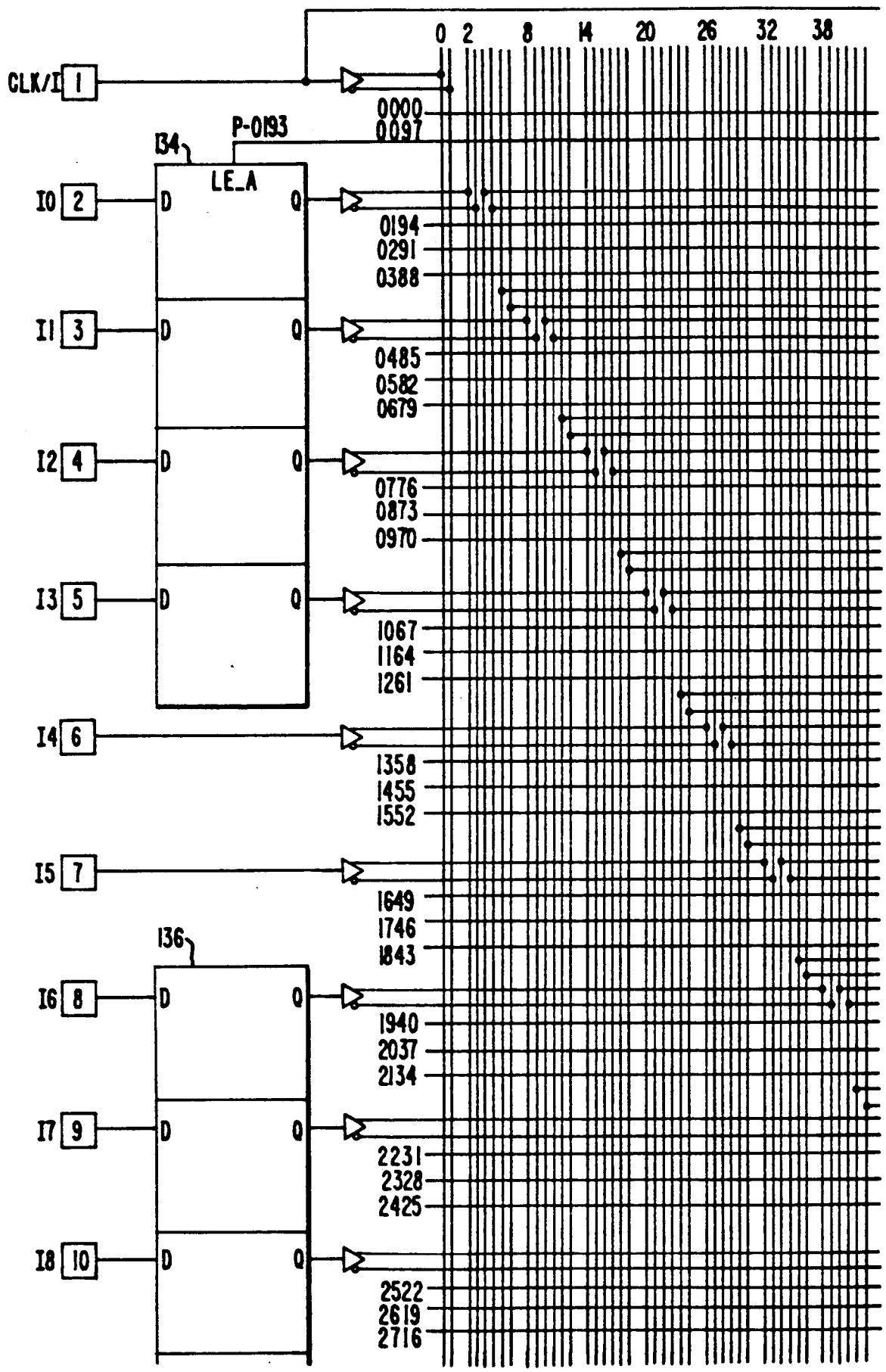
FIG._7B.

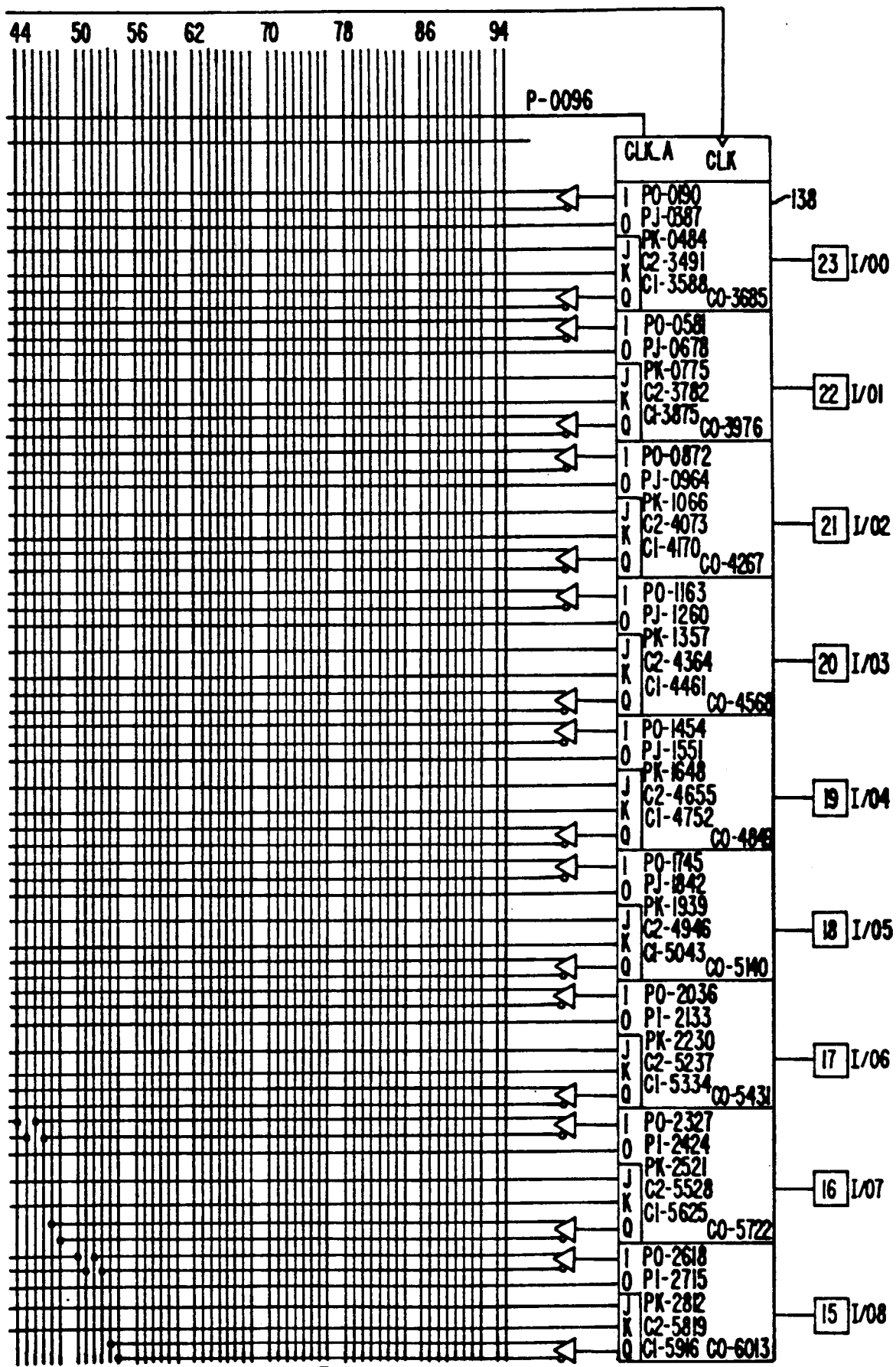
FIG._7C.

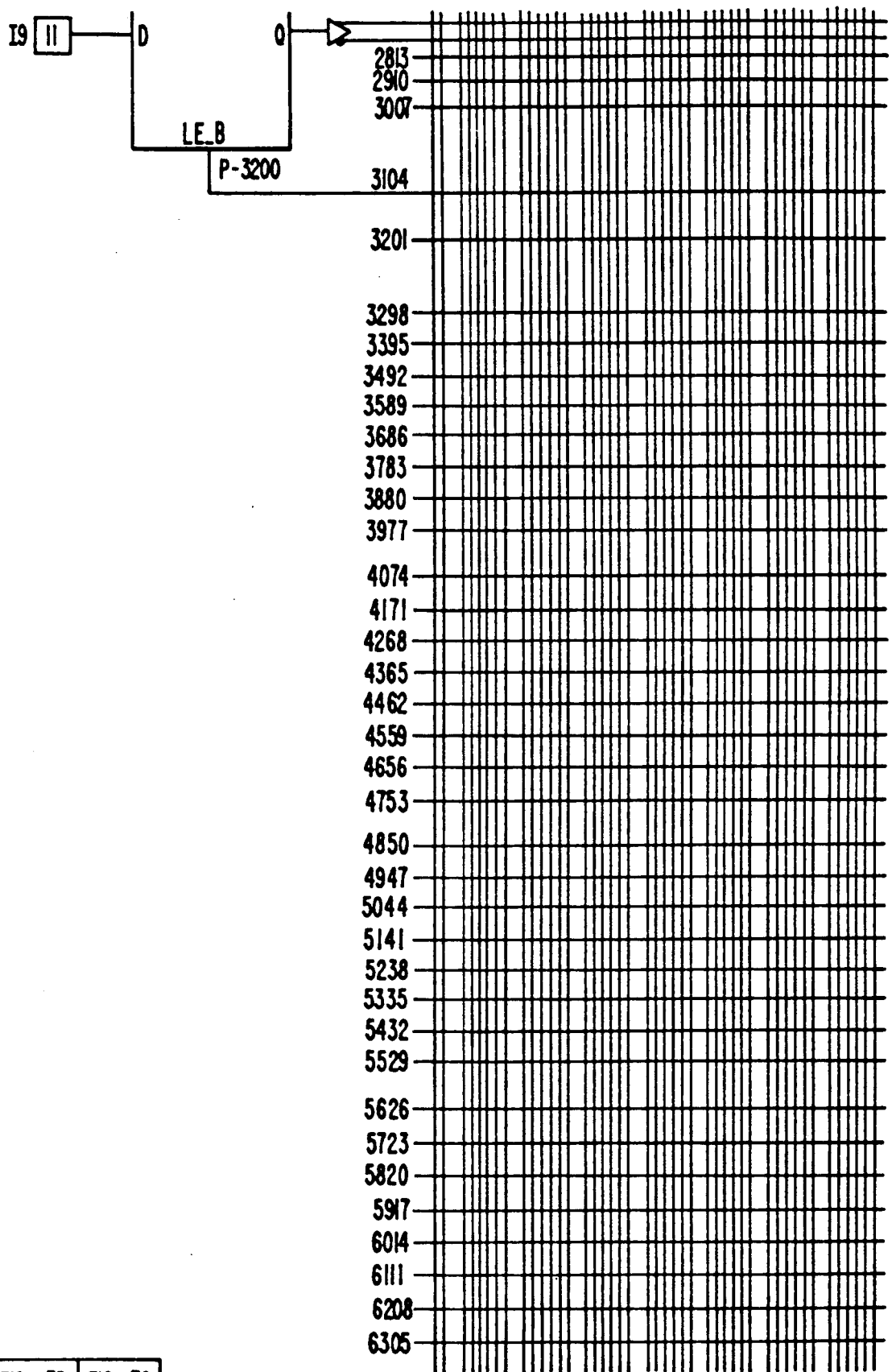
FIG._7D.
| FIG._7B. | FIG._7C. |
| FIG._7D. | FIG._7E. |
FIG._7A.

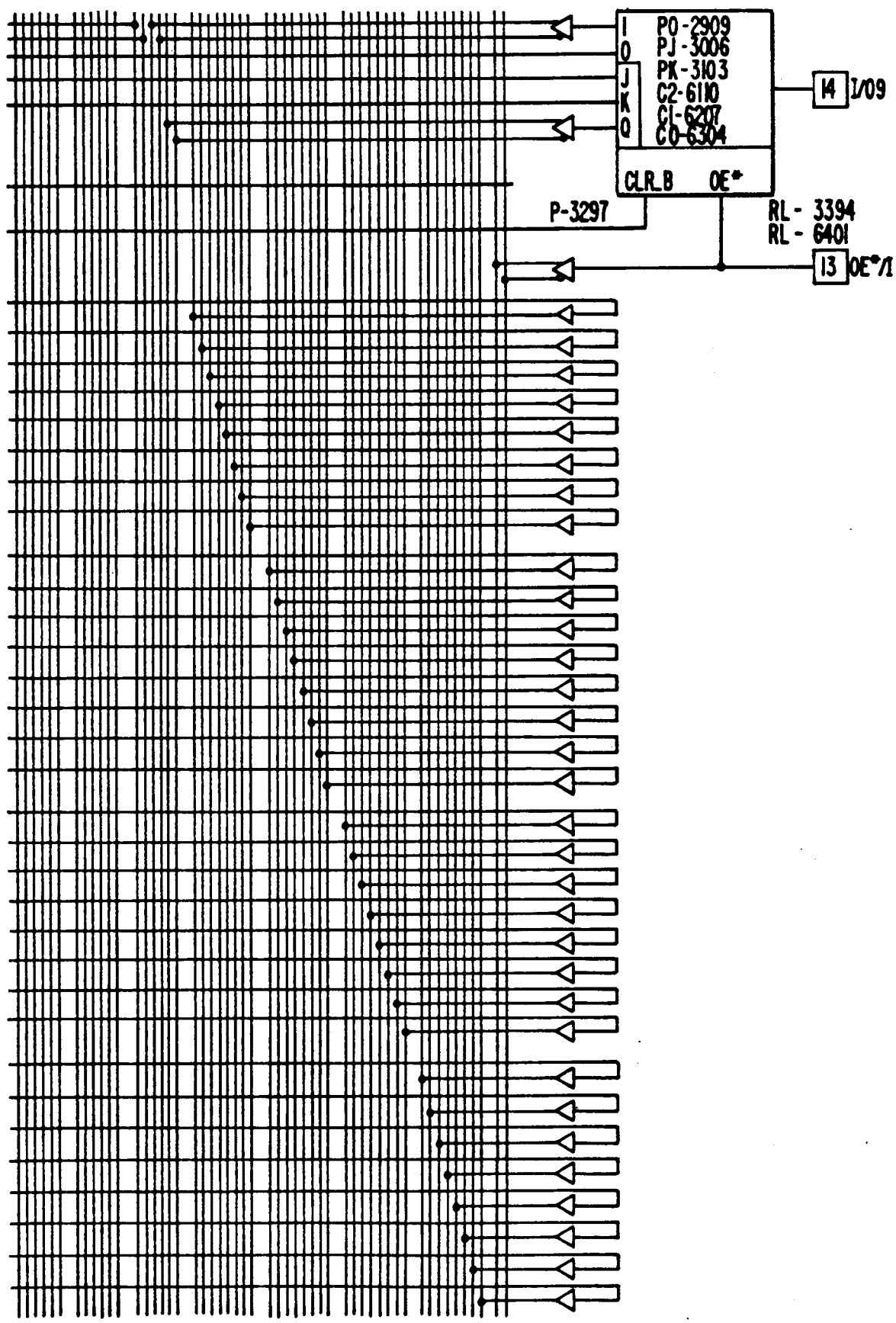
FIG._7E.

SINGLE FUNCTION PROGRAMMABLE LOGIC ARRAY CIRCUIT

BACKGROUND

The present invention relates to a programmable logic array circuit.

Programmable logic arrays (PLAs) and field programmable logic arrays (FPLAs) are well known in the art. PLAs are programmed during their manufacture, while FPLAs can be programmed away from the place where they are manufactured. Typically, FPLAs comprise an array of logical AND gates and an array of logical OR gates which can be programmed for a specific function. Each output function is the sum (logical OR) of selective products, where each product is the product (logical AND) of selected inputs. The FPLAs can be programmed so that any input line can be connected to any AND gate input and any of the products (results of the ANDs) can be summed by any of the OR gates. One way the FPLA can be programmed is by blowing or not blowing a fusable link coupling an input to a logical AND gate or an AND gate output to a logical OR gate.

Programmable array logic circuits (PALs) are also well known in the art. In general, these devices comprise a plurality of field programmable AND gate arrays connected non-programmably to specific OR gates. (See, for example, U.S. Pat. No. 4,124,899.)

The gates on the logic array circuits are formed by having inputs which can be coupled to a plurality of term lines. This coupling is typically achieved through a transistor connection such that an input line can force the term line, through the transistor, to a low voltage level. The term line itself thus acts as the output of the gate, with it being at a high level only if none of the inputs are causing a transistor to pull it to a low level (NOR gate). Other mechanisms are possible for coupling an input line to a term line to result in a NAND gate configuration rather than a NOR gate configuration.

One disadvantage of FPLAs and PAL circuits are that the output of the logical arrays is always a function of the result of specified AND gates followed by OR gates. Thus, a single level Boolean logic circuit output (only AND or only OR) is not available.

The PLAs incorporate two programmable array planes in order to give the combination of random AND functions and random OR functions. Because a signal must propagate through both of these planes, these circuits have a long propagation time. The PAL circuits have a rigid configuration in which product terms are wasted in some applications since they are not used. The fixed requirement of AND gates feeding OR gates means that random logic is not possible and thus a schematic type entry cannot be achieved unless the schematic is specifically designed to be built of AND-/OR combination building blocks. The rigid configuration of these circuits results in an inefficient use of the terms.

SUMMARY OF THE INVENTION

The present invention is a programmable logic array which can produce single level logic or can produce multiple level logic through the use of internal feedback loops. A plurality of input lines intersect a plurality of term lines and can be programmably coupled to the term lines. A number of term lines provide a feedback input which intersects all of the term lines and can be programmably coupled to the term lines. The input lines and the feedback input lines form a single matrix with the term lines.

Preferably, both noninverted and inverted inputs are provided to the matrix. Each term is connected to a polarity control element which can be configured to either invert or not invert the term line NOR gate signal. The feedback inputs are noninverted since any function requiring inversion can be collapsed so that it can be built from a noninverted feedback with the availability of inverted inputs and outputs.

By using DeMorgan's theorem, the NOR function of the term line can be used to form any one-level Boolean logic function (AND, NAND, OR, or NOR) by inverting the input, inverting the output, or some combination thereof. Thus, the present invention presents a generic one-level gate which can implement any schematic design. The internal feedback allows multiple level circuits without requiring an output from the device to be fed back to another pin input of the device.

The circuit of the present invention can be enhanced by providing registers or latches at the output. An additional feedback path from the output with both inverted and noninverted lines is also provided. Thus, when the number of inputs required exceeds the number of outputs, one of the output lines can be used via its inverting and noninverting lines as an input. In addition, a term line which is used as an output can also be used as a feedback input, or can be used solely as a feedback if no output is required on one pin.

In addition to allowing the formation of one-level Boolean logic functions, the terms of the present invention can be used to form latches and other logic devices by utilizing the feedback provisions of the circuit.

For a fuller understanding of the nature and advantages of the invention, reference should be made to the ensuing detailed description taken in conjunction with the accompanying drawings.

BRIEF DESCRIPTION OF THE DRAWINGS

FIG. 1 is a schematic diagram of a programmable array according to the present invention;

FIG. 2 is a schematic diagram of a portion of the array of FIG. 1 showing the connection of the input lines to a term line;

FIG. 2A is a schematic diagram of the logical NOR function of the circuit of FIG. 2;

FIGS. 3 and 3A are a logic diagram of a Boolean OR function and its implementation in the array of FIG. 1, respectively;

FIGS. 4 and 4A are a logic diagram of an AND gate and its implementation in the circuit of FIG. 1, respectively;

FIGS. 5 and 5A are a logic diagram of a multiple level gate (2-level sum-of-products) and its implementation in the array of FIG. 1, respectively;

FIGS. 5B and 5C are schematic diagrams showing an example of unreduced logic and reduced logic, respectively, for eliminating an OR feedback requirement;

FIGS. 6 and 6A are a logic diagram of an SR latch and its implementation in the array of FIG. 1, respectively;

FIG. 7A-7E is a schematic diagram of a semiconductor chip design incorporating the array of FIG. 1; and FIG. 8 is a block diagram of an output cell of FIG. 7.

DETAILED DESCRIPTION OF THE PREFERRED EMBODIMENTS

FIG. 1 shows an array 10 according to the present invention. A plurality of input drivers 12 receive a plurality of input signals (shown as A, B, C ... Z). Each input driver 12 produces a noninverted input 14 and an inverted input 16. Inputs 14 and 16 intersect a plurality of terms 18 and a plurality of feedback terms 20. Each term 18 is provided with a polarity control element 22 which can either invert or not invert the term provided to an output. Each of terms 20 is provided through a noninverted driver 24 to a feedback input line 26.

Electrically, each term line 18 is based on a NOR function of its input lines 14, 16 and 26. The first step in programming is to select which input lines each NOR function will act on. Inputs are selected by enabling or disabling a programmable element at each term input. These programmable elements (not shown) exist at each intersection of a term line 18 and an input line 14, 16 or 26. These programmable elements are commonly referred to as "fused," although physically they may be an EEPROM storage cell or other similar device. A fuse state of zero (intact) enables the input, and a fuse state of one (blown) disables the input. For each term 18, enabled inputs driven to a high state will force the NOR function to a low state. All enabled inputs must be driven to a low state for the NOR function to assume a high state.

This can be seen more clearly in FIG. 2. Each input line 14 or 16 is coupled to the gate of an MOS transistor 28. The source of the transistor is grounded with its drain coupled to term line 18 via a fuse 29. Each transistor 28 desired to be coupled to term line 18 can have fuse 29 remain intact, while each transistor 28 not desired to be coupled to term line 18 can have its electrical connection or fuse 29 blown. This is shown logically in FIG. 2A with the connection of each drain to the term line represented by a switch 30, which provides an input to a NOR gate 32. As can be seen, when a high level voltage is applied to the gate of a MOS transistor 28, the transistor will be turned on, thereby coupling term line 18 to ground. If any one input has a high level, the term line will be pulled to ground. The term line will assume a high level only if all of the transistors are off, thus removing any path to ground. A pull-up element 31 serves to pull term line 18 to a high level when all of the transistors are off. Pull-up element 31 could be a resistor, a sense amplifier or any other element which would pull the line to a high level.

While each term 18 operates electrically as a NOR function, selection of the proper input and output polarity allows it to operate logically (via DeMorgan's theorem) as any one-level Boolean logic function (AND, NAND, OR or NOR). The inputs can be inverted simply by coupling an inverted input line 16 rather than a noninverted input line 14. The outputs can be inverted by enabling a polarity control element 22 to invert the term output. The following table shows how any of the logic functions can be constructed using NOR gates:

| Logic Function | Logic Symbol | | NOR Equivalent |
|---|---|---|---|
| OR | $A + B$ | = | $\overline{\overline{A + B}}$ |
| NOR | $\overline{A + B}$ | = | $\overline{A + B}$ |
| AND | $A \cdot B$ | = | $\overline{\overline{A} + \overline{B}}$ |
| NAND | $\overline{A \cdot B}$ | = | $\overline{\overline{\overline{A} + \overline{B}}}$ |

Examples of logic gates constructed in accordance with the above table are shown in FIGS. 3 and 4, with their implementations in the array of FIG. 1 being shown in FIGS. 3A and 4A, respectively. FIG. 3 shows an OR gate 34 which can be constructed using a NOR gate 36 with its output inverted by an inverter 38. This can be accomplished in the array of FIG. 1 as shown in FIG. 3A. A noninverted A input 40 is coupled to a term line 42 at a point 44. The coupling of these lines is indicated by an X at the intersection of the lines. Similarly, the noninverted input 46 for the B input is coupled to term line 42 at point 48. A polarity control element 50 on term line 42 is enabled so that the value on term line 42 is inverted to produce the OR output designated by A+B.

FIG. 4 shows an AND gate 52 which can be constructed using a NOR gate 54 with inverted inputs. The implementation in a circuit according to the present invention is shown in FIG. 4A. The connections required to couple the inverted inputs of A, B and C to a term line 56 are shown at points 58, 59, 61. A polarity control element 60 is in the off position to not invert the output.

FIGS. 5 and 5A show a multiple level logic element and a simple implementation in the array of FIG. 1 using the feedback terms, respectively. FIG. 5 shows a pair of AND gates 62, 64 with their outputs coupled to the inputs of an OR gate 66. This circuit is equivalent to the circuit formed with NOR gates 68, 70 and 72 having inverted inputs to NOR gates 68 and 70 and an inverted output of NOR gate 72.

The implementation of this function on the array of the present invention is shown in FIG. 5A. Inverted inputs $\overline{A}$ and $\overline{B}$ are coupled to a feedback term line 74 at points 76 and 78 respectively. The NOR function of term 74 is then provided to term line 80 via driver 82 and feedback input line 84, which is coupled to term line 80 at a point 86. Similarly, inverted inputs $\overline{C}$ and $\overline{Z}$ are coupled to a feedback term line 88 at points 90 and 92, respectively. The NOR function of term 88 is provided through a driver 94, feedback input line 96 and coupling connection 98 to term line 80. Polarity control element 100 is activated in an on state to invert the output of term line 80 to produce the final product.

As can be seen by the above example, the feedback term lines can feed their output back into the array as an input and thereby allow creation of sum-of-products, product-of-sums, or higher complexity multi-level logic functions (such as those needed for address comparators). The feedback terms can be used for all logic levels up to but not including the last logic level, which must be provided to an output. The feedback terms feedback only the NOR version of their output and do not provide programmable output polarity. This is sufficient since next-level asynchronous logic functions which would require the OR output are easily transformed to eliminate this requirement. This is illustrated in FIGS. 5B and 5C. In FIG. 5B, NOR gate 102 is shown using the OR output from gate 104. This OR requirement is eliminated by using inputs B, C and D directly as inputs to gate 102 as shown in FIG. 5C.

FIGS. 6 and 6A show a logic diagram of an SR latch and its implementation in the array of the present invention, respectively. To implement the SR latch as shown, an additional feedback from term 106 is provided through a driver 108 which provides a noninverted feedback input 110 and an inverted feedback input 112.

The SR latch is connected as follows. The noninverted A input 114 is coupled to term 106 at a point 116. Similarly, the B noninverted input 118 is coupled to a feedback term line 120 at a point 122. The other input to term line 106 is provided from term line 120 through driver 124, feedback input line 126 and connection 128. The other NOR function, represented by term line 120, is provided its second input through the feedback from term 106 through driver 108, feedback input line 110 and connection 130. The polarity control element 132 on term line 106 is set at an off condition so that it does not invert the output.

This configuration of an SR latch provides one of the latch outputs as a term output. Alternately, an internal SR latch could be provided using a feedback term in place of term 106. In addition, polarity control element 132 is not needed and could be eliminated for certain terms as shown below in FIGS. 7 and 8.

The use of driver 108 provides additional flexibility to the present invention. The term outputs, which would normally be supplied to a output pin of a semiconductor device, could alternately be used as an input when not all of the outputs are needed. In this instance, driver 108 would provide a simple noninverted and inverted input to the array.

FIG. 7A-7E shows the implementation of the array of the present invention in a semiconductor chip product having 24 pins (the ground and power pins are not shown). FIG. 7A illustrates the manner of interconnecting sheets 7B-7E, which contain the actual elements of the product implementation. In addition to the elements shown in the previous figures, two sets of 4-bit transparent input latches 134 and 136 are shown. In addition, ten output macro cells 138 are shown. A block diagram of a macro cell 138 is shown in FIG. 8. The transparent latches 134 and 136 allow data to be latched onto the chip before processing, thereby enabling synchronous operation.

The macro cell of FIG. 8 includes a JK latch 140 which allows synchronous functions. A pair of term lines 142, 144 each have polarity control elements 146 and 148, respectively, and provide the J and K inputs to JK latch 140. The JK latch 140 output can be supplied to a I/O pad 150 through a multiplexer 152, a polarity control element 154 and a driver 156. Alternately, the Q output can be fed back to the circuit array along an input line 158 which is provided with an inverted and a noninverted input as shown in FIG. 7. In addition to term lines 142 and 144, a third term line 160 is provided which can be either supplied to the output via multiplexer 152 or can be used as a feedback input via multiplexer 162. An input line 164 for multiplexer 162 provides feedback through a driver which provides an inverted and a noninverted feedback input as shown in FIG. 7 and FIG. 6A. Alternately, multiplexer 162 can be enabled to choose an input line 166 from I/O pad 150 to provide an additional input to the array.

An output enable (OE) signal line 168 provides a control signal to an output control circuit 170 which can enable, disable or put into a high impedance state output driver 156. Control logic not shown provides a multiple bit signal which determines the configurations of multiplexer 152, multiplexer 160, and output control 170 along with the polarity control elements.

Thus, output cell 138 can be programmed along with the inputs to the various term lines to provide the desired logic functions.

As will be understood by those familiar with the art, the present invention may be embodied in other specific forms without departing from the spirit or essential characteristics thereof. For example, the term lines could be constructed such that they perform a NAND function with NAND building blocks being used to give the other Boolean logic functions. All logic functions can be constructed from NAND gates in a manner similar to that shown for NOR gates. A NAND gate would be easier to implement in bipolar technology, while NOR gates are preferred for MOS technology.

In addition, any number of means may be used to couple an input line to a term line, such as a fusable link, or an EEPROM. In addition, the array could be constructed using bipolar, MOS or any other transistor technology. Accordingly, the disclosure of the preferred embodiments of the present invention is intended to be illustrative, but not limiting, of the scope of the invention, which is set forth in the following claims.

What is claimed is:

1. A programmable integrated logic circuit comprising:
    a plurality of term lines;
    a plurality of input lines intersecting said term lines;
    a plurality of feedback input lines intersecting said term lines, each of said feedback input lines originating from one of said term lines and being entirely contained within said circuit; and
    means for selectively coupling said input lines and feedback input lines to said term lines so that each term line acts as a single function logic gate output with the coupled input lines and feedback input lines being inputs to said single function logic gate, said means for selectively coupling including an MOS transistor having a gate coupled to one of said input and feedback input lines and a source coupled to a voltage potential, said means for selectively coupling further including second means for selectively coupling a drain of said MOS transistor to one of said term lines.

2. A programmable integrated logic circuit comprising:
    a plurality of term lines;
    a plurality of input lines intersecting said term lines;
    a plurality of feedback input lines intersecting said term lines, each of said feedback input lines originating from one of said term lines and being entirely contained within said circuit; and
    means for selectively coupling said input lines and feedback input lines to said term lines so that each term line acts as a single function logic gate output with the coupled input lines and feedback input lines being inputs to said single function logic gate, said means for selectively coupling including an MOS transistor having a drain coupled to one of said term lines and a source coupled to a voltage potential, said means for selectively coupling further including second means for selectively coupling a gate of said MOS transistor to one of said input and feedback input lines.

* * * * *